United States Patent

Patrickson

[15] 3,657,558

[45] Apr. 18, 1972

[54] MULTIPLE RAMP WAVEFORM GENERATOR

[72] Inventor: Brian Anthony Patrickson, Maidstone, England

[73] Assignee: Elliott Brothers (London) Limited, London, England

[22] Filed: Oct. 28, 1970

[21] Appl. No.: 86,927

[30] Foreign Application Priority Data

Oct. 28, 1969 Great Britain......................52,745/69

[52] U.S. Cl................................307/228, 307/223, 328/43, 328/127, 328/181

[51] Int. Cl........................................................H03k 4/08

[58] Field of Search...................307/228, 223; 328/181, 43, 328/127, 128, 14

[56] References Cited

UNITED STATES PATENTS

| | | | |
|---|---|---|---|
| 3,278,727 | 10/1966 | Geis | 307/223 X |
| 2,748,272 | 5/1956 | Schrock | 328/181 X |
| 3,281,827 | 10/1966 | Olshausen et al. | 340/347 |
| 3,286,253 | 11/1966 | Leng | 340/347 |
| 3,539,936 | 11/1970 | McGhee | 307/223 |

*Primary Examiner*—Donald D. Forrer
*Assistant Examiner*—R. C. Woodbridge
*Attorney*—Misegades & Douglas, Keith Misegades and George R. Douglas, Jr.

[57] ABSTRACT

The invention is a circuit for generating a pair of interleaved repeating sequences of several ramp signals of differing slopes and lengths. An integrator 10 is energized by a signal on line 13, and produces an output ramp whose slope is controlled by the signal on line 12. The ramp output is compared with the signal from decoder 14 by comparator 15, and on equality flip-flop 16 changes state. This de-energizes integrator 10 and energizes integrator 20, which operates in a similar way to produce a ramp for the other sequence. Integrators 10 and 20 thus produce ramps alternately, as flip-flop 16 changes between its two states. Each time flip-flop 16 changes into one state, it steps on a cyclic counter 30 which feeds its new count to pre-wired decoders 31 to 34 which determine the parameters (slope and height) of the next two ramps, one from each of the two integrators.

5 Claims, 3 Drawing Figures

MULTIPLE RAMP WAVEFORM GENERATOR

The present invention relates to multiple ramp waveform generators.

In certain types of display systems, it is desirable to be able to generate repeatedly a long sequence of ramp waveforms of individually controlled height and length. This sequence of ramp signals can then be used to generate line symbols on the display CRT. The object of the present invention is to provide a simple and effective generator for generating such sequences of ramp waveforms.

Thus according to the invention there is provided a multiple ramp waveform generator comprising: a ramp generator the parameters of whose output can be ontrolled; and a cyclic counter whose state is advanced as each ramp is generated and which drives code conversion means which define, for each state, the desired parameter of the corresponding ramp, the code conversion means controlling the ramp generator.

In some circumstances it is desirable to generate two sequences of interleaved ramp waveforms; these can be used separately, or combined to form a single sequence. To achieve this, the circuitry can be partially but not wholly duplicated, with a bistable flip-flop controlling the alternation between the two sequences. Thus the invention also provides a multiple ramp waveform generator comprising: two ramp generators the parameters of whose outputs can be controlled; a bistable flip-flop each state of which energizes a corresponding one of the ramp generators, and which changes state at the end of each ramp generated by either ramp generator; and a cyclic counter whose state is advanced each time the flip-flop changes into a reference state and which drives code conversion means which define, for each state of the counter, the desired parameters of the corresponding ramps, the code conversion means controlling the ramp generators.

A multiple ramp waveform generating system in accordance with the invention will now be described in detail, by way of example, with reference to the accompanying drawings, in which.

Figure 1:
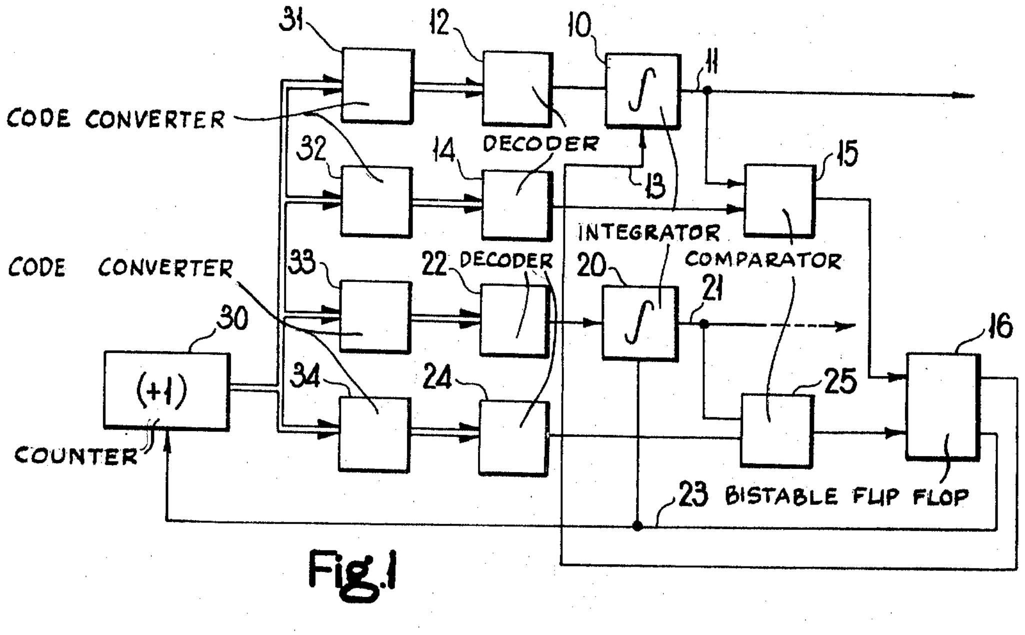
FIG. 1 is a block diagram of the whole system.
Figure 3:
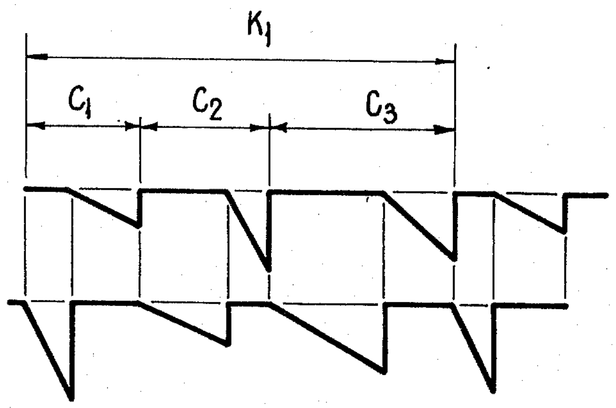
FIG. 3 is a set of waveforms generated by the system.

Referring first to FIG. 3, the system generates two repetitive multiple ramp waveforms $V_{11}$ and $V_{21}$ on lines 11 and 21 respectively (FIG. 1). The full repetition period is shown as $K_1$, and it can be seen that this period is divided up into three sub-periods $C_1$ and $C_3$, each of which contains one ramp waveform on line 11 followed by one ramp waveform on line 21. Thus the full period $K_1$ contains six ramp waveforms altogether; each of these ramp waveforms has its height and its slope controlled independently from the others.

The ramps on lines 11 and 21 are generated by separate generating circuits. Considering only line 11 for the moment, this is driven by an integrator 10 which is turned on by a "false" logical (i.e., binary) signal on an input line 13, and integrates at a rate determined by an analog-type signal on another input from a decoder 12. Hence when the signal on line 13 goes true, the voltage on line 11 will start to fall from its base level and thus generate a ramp.

A second decoder 14 also generates an analog-type signal which is fed, together with the signal on line 11, to a comparator 15, which normally produces a false logical output, but produces a true output when the difference between the voltages from integrator 10 and decoder 14 goes negative. Thus setting the value of the voltage from decoder 14 sets the height of the ramp voltage on line 11 at which the signal from comparator 15 goes true.

The output from comparator 15 is fed to a bistable flip-flop 16, whose corresponding output feeds line 13 which energized integrator 10. Thus if the flip-flop 16 is initially set to the state which makes line 13 false, the voltage on line 11 falls steadily along a ramp until the output of comparator 15 goes true. The flip-flop will then change state, integrator 10 will be de-energized, the voltage on line 11 will return to the base level, and the output of comparator 15 will go false. Flip-flop 16 will remain in its new state, and the voltage on line 11 will remain at its base level until flip-flop 16 has its state changed again by some other means.

Considering now line 21, this is driven by an integrator 20 similar to integrator 10. Integrator 20 is controlled by a decoder 22 and a line 23 fed from the other output of flip-flop 16 from line 13. Line 21 and decoder 24 feed a comparator 25, similar to comparator 15, which feeds the other input of flip-flop 16 from comparator 15. Thus the circuitry for generating waveform $V_{21}$ is similar to that for generating waveform $V_{11}$, but the "$V_{21}$ circuitry" is energized by flip-flop 16 when the "$V_{11}$ circuitry" is de-energized, and vice versa. Consequently, each time a ramp waveform on one of lines 11 and 21 ends and flip-flop 16 changes state, a ramp waveform on the other of these two lines begins.

So far the control of the decoders 12, 14, 22, and 24 has not been discussed, and it has been implicitly assumed that their outputs are constant. In fact, line 13 from flip-flop 16 feeds a three-state cyclic counter 30, so that each time line 13 goes true the count of counter 30 is advanced by 1. This counter feeds four similar code converters 31 to 34, which feed the four decoders 12, 14, 22, and 24 respectively. Taking code converter 31, this generates an $n$-bit binary output (on $n$ output lines) for each state of the counter 30, defining the slopes of the three successive ramp signal of waveform $V_{11}$. The output from each code converter is duly decoded into analog form by its associated decoder. Thus as the counter 30 cycles through its three states repetitively, so it defines (by means of the code converters) for each state the slope and height of the two ramps generated in that state (one on line 11 and the other on line 21).

The counter 30 may be a binary counter with a reset circuit which cuts its count short at some count less than a power 2. The code converters 31 to 34 may conveniently be diode matrices, and may be partially combined to reduce the number of diodes at the cost of greater complexity.

Figure 2:
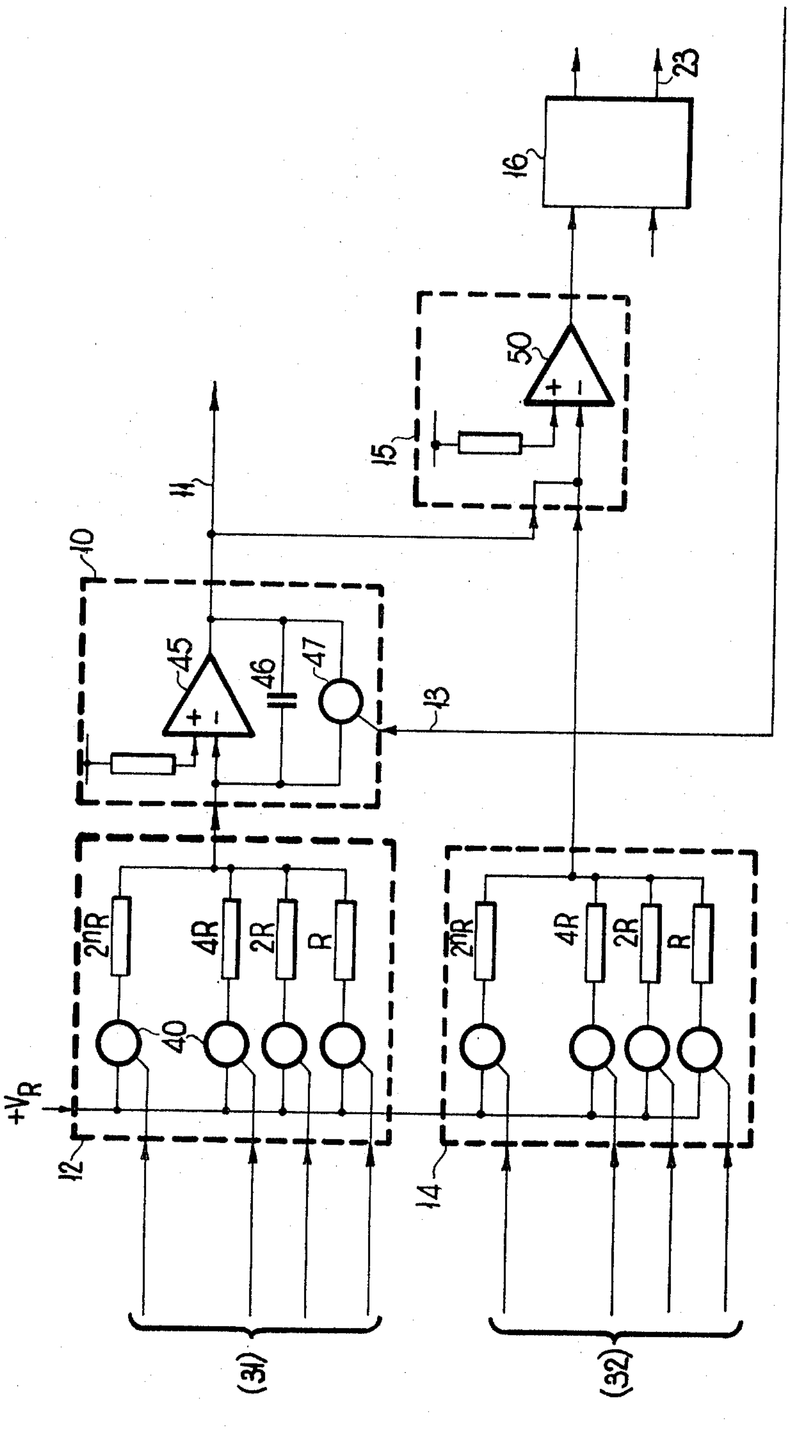
FIG. 2 is a more detailed diagram of some parts of the system.

FIG. 2 shows the circuitry of some parts of the system in more detail. The integrator 10 consists of an amplifier 45 with a capacitor 46 and an "analog gate" 47 connected across it. This gate 47 presents a short-circuit when line 13 is true, thus de-energizing the integrator. The decoder 12 consists of a "ladder" of resistors whose values are proportional to powers of 2, each in series with an "analog gate" 40 between a reference voltage $+V_R$ and the output of the decoder. The decoder 14 is similar. The comparator 15 consists of a high-gain amplifier fed with the difference between the output of decoder 14 and the voltage on line 11.

I claim:

1. A multiple ramp waveform generator comprising a ramp generator, the parameters of whose output can be controlled, the ramp generator comprising an integrator whose output slope is controlled by a first reference voltage forming its input, and a comparator which produces an output signal when the integrator output passes a second reference voltage, the integrator being de-energized by the signal from the comparator, and a cyclic counter whose state is advanced as each ramp is generated and which drives code conversion means which define, for each state, the desired parameters of the corresponding ramp, the code conversion means controlling the ramp generator and determining the two reference voltages.

2. A waveform generator according to claim 1, wherein the code conversion means comprises two digital code converters each feeding a respective digital-to-analog decoder.

3. A multiple ramp waveform generator comprising:

two ramp generators the parameters of whose outputs can be controlled;

a bistable flip-flop each state of which energizes a corresponding one of the ramp generators, and which changes state at the end of each ramp generated by either ramp generator; and a cyclic counter whose state is advanced each time the flip-flop changes into a reference state and which drives code conversion means which define, for each state of the counter, the desired parameters of the corresponding ramps, the code conversion means controlling the ramp generators.

4. A waveform generator according to claim 3, wherein each ramp generator comprises an integrator whose output slope is controlled by a first reference voltage forming its input, and a comparator which produces an output signal when the integrator output passes a second reference voltage, the integrator being de-energized by the signal from the comparator, and the code conversion means determining the two reference voltages for each ramp generator.

5. A waveform generator according to claim 4, wherein the code conversion means comprises four digital code converters each feeding a respective digital-to-analog decoder.

* * * * *